United States Patent
Aziz et al.

(10) Patent No.: US 6,750,609 B2
(45) Date of Patent: Jun. 15, 2004

(54) OLEDS HAVING LIGHT ABSORBING ELECTRODE

(75) Inventors: Hany Aziz, Burlington (CA); Nan-Xing Hu, Oakville (CA); Zoran D. Popovic, Mississauga (CA); James M. Duff, Mississauga (CA)

(73) Assignee: Xerox Corporation, Stamford, CT (US)

( * ) Notice: Subject to any disclaimer, the term of this patent is extended or adjusted under 35 U.S.C. 154(b) by 201 days.

(21) Appl. No.: 09/935,031

(22) Filed: Aug. 22, 2001

(65) Prior Publication Data

US 2003/0038593 A1 Feb. 27, 2003

(51) Int. Cl.$^7$ .................................................. H01J 1/62
(52) U.S. Cl. ........................ 313/506; 313/503; 313/512
(58) Field of Search .............................. 313/504, 506, 313/311, 5.3, 512

(56) References Cited

U.S. PATENT DOCUMENTS

| | | | | |
|---|---|---|---|---|
| 4,287,449 | A | | 9/1981 | Takeda et al. ............... 313/509 |
| 5,049,780 | A | | 9/1991 | Dobrowolski et al. ...... 313/509 |
| 5,834,893 | A | * | 11/1998 | Bulovic et al. .............. 313/506 |
| 6,420,031 | B1 | * | 7/2002 | Parthasarathy et al. .. 428/411.1 |
| 6,429,451 | B1 | * | 8/2002 | Hung et al. .................... 257/40 |
| 2002/0033664 | A1 | * | 3/2002 | Kobayashi .................. 313/504 |
| 2002/0180349 | A1 | | 12/2002 | Aziz et al. ................... 313/506 |

FOREIGN PATENT DOCUMENTS

| | | |
|---|---|---|
| EP | 1 160 890 A2 | 12/2001 |
| JP | 8-222374 | 8/1996 |
| WO | WO 01/08240 A1 | 2/2001 |

OTHER PUBLICATIONS

Liang–Sun Hung et al., U.S. Ser. No. 09/577,092, filed May 24, 2000, titled "Reduction of Ambient–Light–Reflection in Organic Light–Emitting Devices" (80539).

Yoon–Fei Liew et al., U.S. Ser. No. 09/800,716, filed Mar. 8, 2001, titled "Cathodes for Electroluminescent Devices Having Improved Contrast and Reduced Dark Spot Growth" (D/A1034).

O. Renault et al., "A low reflectivity multilayer cathode for organic light–emitting diodes," *Thin Solid Films*, vol. 379, pp. 195–198 (Dec. 8, 2000).

David Johnson et al., "Contrast Enhancement of OLED Displays," http://www.luxell.com/pdfs/OLED_tech_ppr.pdf, pp. 1–3 (Apr. 2001).

* cited by examiner

*Primary Examiner*—Vip Patel
(74) *Attorney, Agent, or Firm*—Zosan S. Soong

(57) ABSTRACT

An organic light emitting device composed of: a first electrode; a second electrode; and a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

16 Claims, 2 Drawing Sheets

OLEDS HAVING LIGHT ABSORBING ELECTRODE

BACKGROUND OF THE INVENTION

Organic light emitting devices (OLEDs) represent a promising technology for display applications. A typical organic light emitting device includes a transparent first electrode, which usually acts as a hole-injecting anode; a luminescent region comprising one or more electroluminescent organic layer(s); and a second electrode (also called a "back electrode"), which usually acts as an electron-injecting cathode. In order to facilitate electron injection from the back electrode into the electroluminescent layer(s), the back electrode generally is formed of a low work function metal, and therefore is highly reflective. When a voltage is applied across the first and second electrodes, light is emitted from the electroluminescent layer(s) and through the transparent anode. When viewed under high ambient illumination, the reflective back electrode reflects a substantial amount of the ambient illumination to the observer, which results in higher ratios of reflected illumination as compared to the device's own emission, which results in "washout" of the displayed image.

In order to improve the contrast of electroluminescent displays in general, light absorbing layers as described, for example, in U.S. Pat. No. 4,287,449, or optical interference members as described, for example, in U.S. Pat. No. 5,049,780, have been used to reduce the ambient illumination reflection. Both of these approaches involve the use of optical films made of materials that are generally non-conductive. These properties limit the applicability of such materials to organic light emitting devices, which, unlike inorganic electroluminescent phosphor devices, require the direct injection of charges from the electrodes to the electroluminescent layer(s). In addition, the fabrication of such optical films, essentially from dielectric inorganic materials, often requires the use of sputtering or electron beam evaporation techniques. These fabrication techniques require additional instrumentation to be incorporated into the otherwise relatively simple fabrication process of organic light emitting devices by thermal evaporation or spin coating techniques. Also, in cases using optical interference effects for achieving improved contrast, such as disclosed, for example, in U.S. Pat. No. 5,049,780, it is usually required to use more than one optical film in order to achieve the desired improvement, which is disadvantageous to the fabrication process. Furthermore, the resulting improvement in display contrast is inevitably dependent on the viewing angle.

Thus, there is a need, addressed by the present invention, for new OLEDs that avoid or minimize a number of the disadvantages described above for conventional electroluminescent devices.

Organic light emitting devices are disclosed in the following:

Pending U.S. Ser. No. 09/800,716 (titled "cathodes for electroluminescent devices having improved contrast and reduced dark spot growth"), assigned to Xerox Corporation; and O. Renault et al., "A low reflectivity multilayer cathode for organic light-emitting diodes," *Thin Solid Films*, Vol. 379, pp. 195–198 (Dec. 8, 2000);

International Application Publication No. WO 01/08240 A1; and

David Johnson et al., "Contrast Enhancement of OLED Displays," http://www.luxell.com/pdfs/OLED_tech_ppr.pdf, pp. 1–3 (April 2001).

SUMMARY OF THE INVENTION

The present invention is accomplished in embodiments by providing an organic light emitting device comprising:

a first electrode;

a second electrode; and a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

There is also provided in embodiments an organic light emitting device comprising in sequence:

(a) a cathode including:
    (i) an electrically conductive light absorbing layer, and
    (ii) a substantially transparent electron injecting layer;
(b) a luminescent region including an organic electroluminescent material; and
(c) an anode that is substantially transparent to light.

There is provided in additional embodiments an organic light emitting device comprising in sequence:

(a) a cathode that is substantially transparent to light;
(b) a luminescent region including an organic electroluminescent material; and
(c) an anode including:
    (i) a substantially transparent hole injecting layer, and
    (ii) an electrically conductive light absorbing layer.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

The present organic light emitting device is composed of at least a first electrode; a second electrode; and a luminescent region including an organic electroluminescent material between the first electrode and the second electrode, wherein one of the first electrode and the second electrode includes both a substantially transparent charge injecting layer adjacent to the luminescent region and an electrically conductive light absorbing layer. Either the cathode or the anode can include the charge injecting layer and the electrically conductive light absorbing layer. The charge injecting layer may be either an electron injecting layer (in the case of a cathode) or a hole injecting layer (in the case of an anode). The present organic light emitting device may include a substrate either as a separate layer adjacent to one of the electrodes or incorporated into one of the electrodes (e.g., the electrically conductive light absorbing layer that is part of an electrode includes in embodiments a substrate material to result in an electrically conductive light absorbing substrate).

Figure 1:
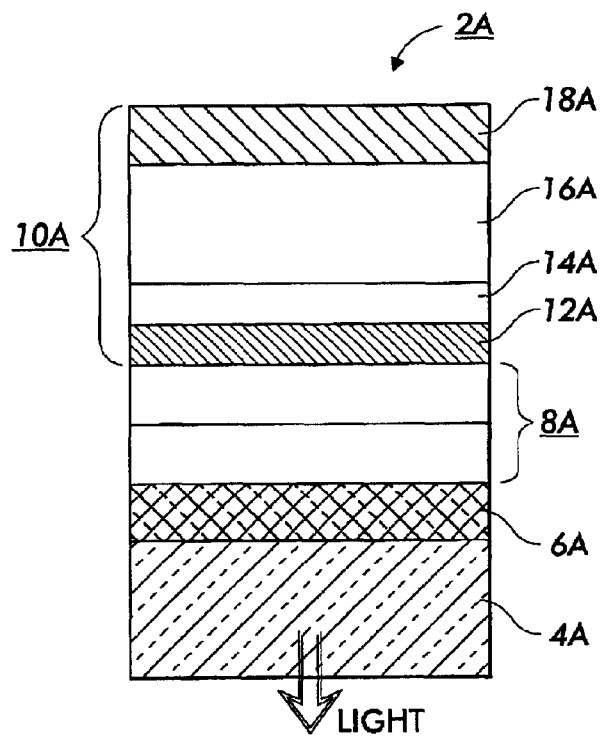
FIG. 1 is a schematic, elevational view in cross-section of a first embodiment of the present OLED.

A first exemplary embodiment is seen in FIG. 1 where the organic light emitting device 2A is composed of in the depicted sequence: a substrate 4A; an anode 6A; a luminescent region 8A; and a cathode 10A including a substantially transparent electron injecting layer 12A, an optional buffer layer 14A, an electrically conductive light absorbing layer 16A, and an optional metallic layer 18A. In FIG. 1, the anode 6A and substrate 4A are substantially transparent so that light emitted within the luminescent region can reach the viewer.

As used herein, the phrase "substantially transparent" indicates a significant level of light transmissivity through a layer such as for example at least about 50% transmissivity, particularly at least about 70% transmissivity.

Figure 2:
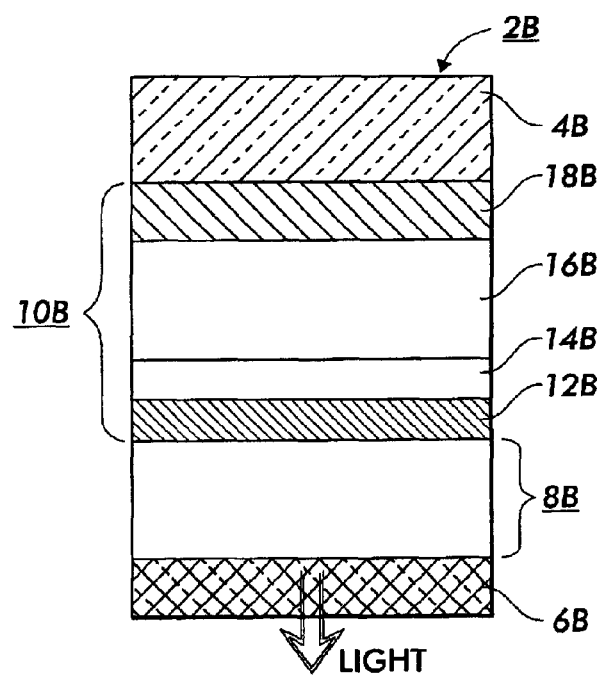
FIG. 2 is a schematic, elevational view in cross-section of a second embodiment of the present OLED.

A second exemplary embodiment is seen in FIG. 2 where the organic light emitting device 2B is composed of in the depicted sequence: an anode 6B; a luminescent region 8B; and a cathode 10B including a substantially transparent electron injecting layer 12B, an optional buffer layer 14B, an electrically conductive light absorbing layer 16B, and an optional metallic layer 18B; and a substrate 4B. In FIG. 2, the anode 6B is substantially transparent so that light emitted within the luminescent region can reach the viewer.

Figure 3:
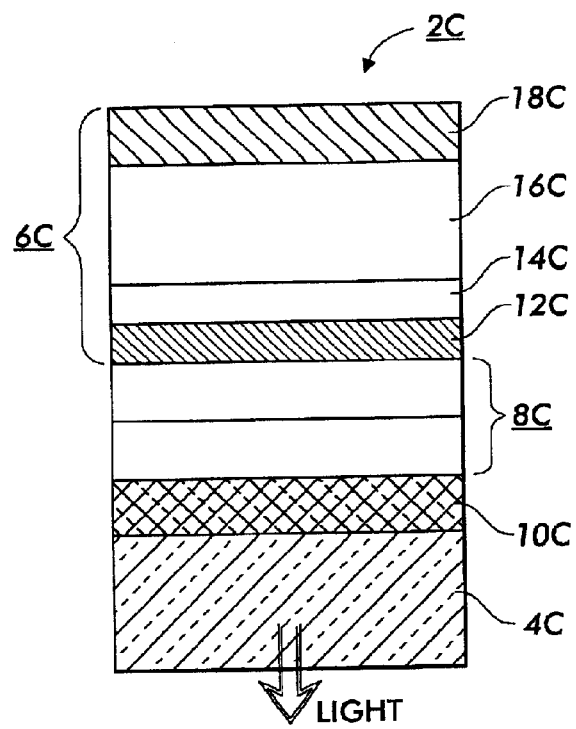
FIG. 3 is a schematic, elevational view in cross-section of a third embodiment of the present OLED.

A third exemplary embodiment is seen in FIG. 3 where the organic light emitting device 2C is composed of in the depicted sequence: a substrate 4C; a cathode 10C; a luminescent region 8C; and an anode 6C including a substantially transparent hole injecting layer 12C, an optional buffer layer 14C, an electrically conductive light absorbing layer 16C, and an optional metallic layer 18C. In FIG. 3, the cathode 10C and substrate 4C are substantially transparent so that light emitted within the luminescent region can reach the viewer.

Figure 4:
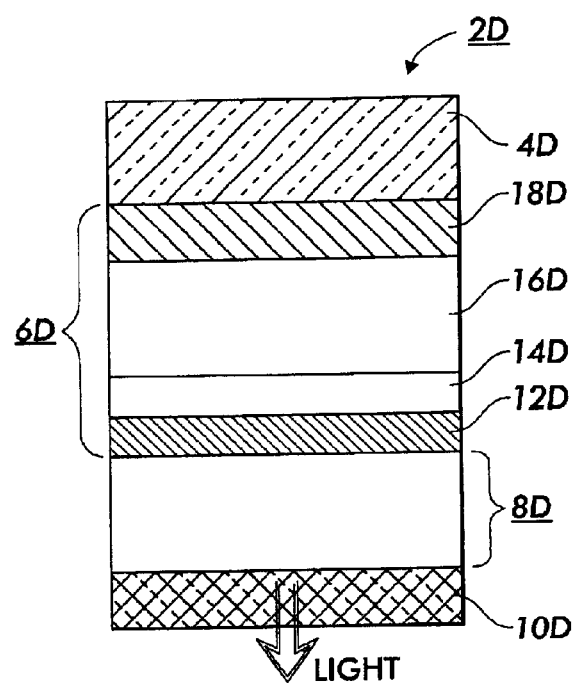
FIG. 4 is a schematic, elevational view in cross-section of a fourth embodiment of the present OLED.

A fourth exemplary embodiment is seen in FIG. 4 where the organic light emitting device 2D is composed of in the depicted sequence: a cathode 10D; a luminescent region 8D; and an anode 6D including a substantially transparent hole injecting layer 12D, an optional buffer layer 14D, an electrically conductive light absorbing layer 16D, and an optional metallic layer 18D; and a substrate 4D. In FIG. 4, the cathode 10D is substantially transparent so that light emitted within the luminescent region can reach the viewer.

FIGS. 1–4 depict a single light absorbing layer. In other embodiments, however, two or more light absorbing layers may be present.

The reason for improved contrast by the present invention is now discussed. The incorporation of a substantially transparent charge injecting layer (12A, 12B, 12C, 12D) results in the transmission of a substantial portion of ambient light reaching this layer, and therefore, the portion of ambient light that is reflected back from this layer to the viewer is substantially reduced. Furthermore, the incorporation of an electrically conductive light absorbing layer (16A, 16B, 16C, 16D) absorbs a substantial portion of the ambient light that is transmitted through the charge injecting layer (and the optional buffer layer), and therefore, a substantial portion of the ambient light that reaches the optional metallic layer is not reflected back to the viewer, and hence image washout is substantially reduced.

The amount of light absorption of the light absorbing layer depends on the extinction coefficient of the light absorbing material comprising the light absorbing layer, as well as on the thickness of the light absorbing layer, where, in general, a higher value for the extinction coefficient and a larger layer thickness lead to more light absorption, and hence are more desirable in embodiments. Also, the higher the extinction coefficient of the material, the less the thickness needed to achieve a certain amount of light absorption.

The multi-layer electrode of the present OLED (having the charge injecting layer and the electrically conductive light absorbing layer) exhibits as a whole both lateral electrical conductivity (across the width of the electrode) and cross directional electrical conductivity (through the thickness of the electrode). However, in certain embodiments, a layer of the multi-layer electrode such as the optional buffer layer, may exhibit cross directional conductivity but not lateral conductivity. That each of the electrode layers is considered part of the electrode arises from the fact that each of (1) the charge injecting layer, (2) the electrically conductive light absorbing layer, and the (3) the optional protective metallic layer contribute to both lateral conduction and cross directional conduction. The optional buffer layer, being made of an insulative material, does not contribute to lateral conduction, but is considered part of the electrode because if the buffer layer is thin enough, it can sustain cross directional conduction. In embodiments of the present invention, the multi-layer electrode is a stack of adjacent layers where each layer exhibits a cross directional electrical conductivity with an ohmic resistance less than about 100 ohms, particularly less than about 10 ohms, and especially less than about 1 ohm.

A substantially transparent substrate can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Other substrate materials can also be selected provided, for example, that the materials can effectively support the other layers, and do not interfere with the device functional performance.

An opaque substrate can comprise various suitable materials including, for example, polymeric components like polyesters such as MYLAR®, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, halides, hydroxides, sulfides and others.

The substrate may have a thickness ranging for example from about 10 to about 5,000 micrometers, and more particularly from about 25 to about 1,000 micrometers.

A substantially transparent anode (such as that used in the OLED devices of FIGS. 1–2) can comprise suitable positive charge injecting materials such as indium tin oxide (ITO), silicon, tin oxide, and metals with a work function ranging from about 4 eV to about 6 eV such as gold, platinum, and palladium. Other suitable materials for the anode include, but are not limited to, electrically conductive carbon, π-conjugated polymers such as polyaniline, polythiophene, polypyrrole, and the like having, for example, a work function equal to, or greater than, about 4 eV, and particularly from about 4 eV to about 6 eV. A substantially transparent anode can comprise very thin substantially transparent metallic layers, comprising a metal with a work function ranging from about 4 eV to about 6 eV such as gold, palladium and the like, having a thickness, for example, from about 10 Å to about 200 Å, and, particularly, from about 30 Å to about 100 Å. Additional suitable forms of the anode are disclosed in U.S. Pat. Nos. 4,885,211 and 5,703,436, which are incorporated herein by reference in their entirety.

The thickness of the substantially transparent anode can range from about 10 Å to about 50,000 Å, with the preferred range depending on the optical constants of the anode material. One illustrative range of anode thickness is from about 300 Å to about 3,000 Å. Of course, a thickness outside of this range can also be used.

A substantially transparent cathode (such as that used in the OLED devices of FIGS. 3–4) can comprise very thin substantially transparent metallic layers comprising a metal with a work function ranging from about 2 eV to about 4 eV, such as Mg, Ag, Al, Ca, In, Li and their alloys such as Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 Å to about 200 Å, and, particularly, from about 30 Å to about 100 Å. Other substantially transparent cathodes are disclosed in U.S. Ser. No. 09/800,716, cited earlier, and incorporated herein by reference in its entirety, such as cathodes comprising a layer, of thickness from about 100 Å to about 10,000 Å, and particularly from about 500 Å to about 5,000 Å, comprised of a metal, an organic material, and a third component which can be a metal, an organic material, or any other material. One embodiment is a cathode composed of a layer comprised of about 47.4 volume percent of Mg, about 5.2 volume percent of Ag, and about 47.4 volume percent of tris(8-hydroxyquinoline) aluminum ($AlQ_3$). Additional suitable forms of substantially transparent cathodes are disclosed in U.S. Pat. No. 5,703,436, which is incorporated herein by reference in its entirety.

The thickness of the substantially transparent cathode can range from about 10 Å to about 50,000 Å, with the preferred range depending on the optical constants of the cathode material. One illustrative range of cathode thickness is from about 30 Å to about 100 Å. Another illustrative range is from about 50 Å to about 500 Å. Of course, a thickness outside of this range can also be used.

A substantially transparent electron injecting layer can include very thin substantially transparent metallic layers, composed of a metal with a work function ranging from about 2 eV to about 4 eV, such as Mg, Ag, Al, Ca, In, Li and their alloys such as Mg:Ag alloys composed of, for example, from about 80 to 95 volume percent of Mg and about 20 to about 5 volume percent of Ag, and Li:Al alloys, composed of, for example, from about 90 to 99 volume percent of Al, and from about 10 to about 1 volume percent of Li, and the like, having a thickness, for example, from about 10 Å to about 200 Å, and, particularly, from about 30 Å to about 100 Å. Other substantially transparent electron injecting layers are disclosed in U.S. Ser. No. 09/800,716, cited earlier, and incorporated herein by reference in its entirety, such as a layer, of thickness from about 100 Å to about 10,000 Å, and particularly from about 500 Å to about 5,000 Å, comprised of a metal, an organic material, and a third component which can be a metal, an organic material, or any other material. One embodiment is a layer composed of about 47.4 volume percent of Mg, about 5.2 volume percent of Ag, and about 47.4 volume percent of tris(8-hydroxyquinoline) aluminum ($AlQ_3$).

The thickness of a substantially transparent electron injecting layer can range from about 10 Å to about 50,000 Å, with the preferred range depending on the optical constants of the cathode material. One illustrative range of thickness of the electron injecting layer is from about 30 Å to about 100 Å. Another illustrative range is from about 50 Å to about 500 Å. Of course, a thickness outside of this range can also be used.

A substantially transparent hole injecting layer can be composed of suitable positive charge injecting materials such as indium tin oxide (ITO), silicon, tin oxide, and metals with a work function ranging from about 4 eV to about 6 eV, such as, gold, platinum, and palladium. Other suitable materials for the hole injecting layer include, but are not limited to, electrically conductive carbon, t-conjugated polymers such as polyaniline, polythiophene, polypyrrole, and the like having, for example, a work function equal to, or greater than, about 4 eV, and particularly from about 4 eV to about 6 eV. A substantially transparent hole injecting material can be composed of very thin substantially transparent metallic layers, comprising a metal with a work function ranging from about 4 eV to about 6 eV, such as gold, palladium and the like, having a thickness, for example, from about 10 Å to about 200 Å, and, particularly, from about 30 Å to about 100 Å. Additional suitable forms of hole injecting layers are disclosed in U.S. Pat. Nos. 4,885,211 and 5,703,436, which are incorporated herein by reference in their entirety.

The thickness of a substantially transparent hole injecting layer can range, for example, from about 10 Å to about 50,000 Å, with the preferred range depending on the optical constants of the selected material. One illustrative range of thickness of the hole injecting layer is from about 30 Å to about 100 Å. Another illustrative range is from about 50 Å to about 500 Å. Of course, a thickness outside of this range can also be used.

Where the charge injecting layer and the light absorbing layer may undesirably react with one another if the two layers are in contact, or where the charge injecting layer may be damaged during coating of the light absorbing layer on it, thereby degrading the performance of the organic light emitting device, the presence of an intervening buffer layer will prevent or minimize such reactions or damage. A buffer layer, therefore, will include a material that may not undesirably react with both the charge injecting layer and the light absorbing layer, and also that may protect the charge injecting layer from possible damage during coating of the light absorbing layer on it. Examples of materials that can be selected to comprise the buffer layer are metallic compounds such as metal oxides like $Al_2O_3$, metal halides like $MgF_2$, and others. Other materials that can be selected to form the buffer layer include porphyrins like metal phthalocyanine such as copper phthalocyanine. Preferred materials that can be used include SiO, $SiO_2$ or mixtures thereof. The buffer layer is preferably non-reflective. In embodiments, the buffer layer is partially or substantially transparent and/or light absorbing.

The thickness of the buffer layer is selected depending on the materials used to form this buffer layer such that significant cross directional conduction from the electrically conductive light absorbing layer to the charge injecting layer across the buffer layer is not interrupted by the buffer layer. Typically, the thickness of the buffer layer can range from about 10 Å to about 5,000 Å, particularly from about 50 Å to about 1,000 Å.

The electrically conductive light absorbing layer can include a single material that combines the desired light absorption and electrical conduction properties such as carbon (e.g., graphite and $C_{60}$), Si, Ge and the like, a metal such as Mo, Ni, Cr, Pd, V, Se, In and their alloys such as INCONNEL™, NICHROME™, and the like, or a conductive light absorbing metal oxide. The electrically conductive light absorbing layer can also be comprised of a blend of two or more materials, wherein at least one of the materials is a light absorbing material such as an organic dye or pigment, such as a phthalocyanine, a perinone, a perylene, a perylene dimer, and the like, and wherein one of the materials is a conductive material, such as a metal like Ag, Al, Au, Cu, Mg, In and the like. When the light absorbing layer is comprised of two or more materials, the concentration of each material in the layer can be adjusted in order to obtain the desired electrical conduction and light absorption properties. For example, the layer can comprise from about 50 volume percent to about 99 volume percent of a light absorbing material and from about 50 volume percent to about 1 volume percent of an electrically conductive material.

The electrically conductive light absorbing layer may have a thickness ranging for example from about 10 Å to about 10,000 Å, where preferred ranges for the thickness can be selected depending on the materials used in forming the layer. One illustrative thickness range is from about 10 Å to about 500 Å. Another illustrative thickness range is from about 500 Å to about 5,000 Å. Yet, another illustrative thickness range is from about 5,000 Å to about 10,000 Å. Of course, a thickness outside of these ranges can also be used.

The phrase "light absorbing" indicates noticeable extinction of light, for example, at least about 50% extinction of light entering the light absorbing layer, particularly at least about 90% extinction of light entering the light absorbing layer. The light absorbing layer functions on a different principle from that of an optical interference layer. The light absorbing layer relies on light absorption, whereas the optical interference layer relies on destructive light interference. Thus, the light absorbing layer achieves a noticeable extinction of light without relying on destructive light interference.

In embodiments, the ohmic resistance for cross directional conduction across the light absorbing layer does not exceed an illustrative value of about 100 ohms; in particular, the ohmic resistance does not exceed another illustrative value of about 10 ohms; in embodiments, the ohmic resistance does not exceed still another illustrative value of about 1 ohm.

Where the collective sheet resistance of the charge injecting layer and the electrically conductive light absorbing layer is too high to sustain significant lateral conduction, such as if the collective sheet resistance of the charge injecting layer and the electrically conductive light absorbing layer exceeds an illustrative value of about 5 ohms per square, or if the light absorbing layer (or any layers underneath it) is degraded as a result of exposure to external environment thereby degrading the performance of the organic light emitting device, a protective metallic layer coated on the light absorbing layer can be used to lower the sheet resistance of the electrode containing the light absorbing layer or to prevent (or at least reduce) the damage caused to the device by the external environment.

The optional metallic layer can be of composed of any suitable metal such as Ag, Au, Al, Mg, In, Ca, Sr and the like, or alloys thereof such as Mg:Ag alloys composed of, for example, from about 80 to 95 volume percent of Mg and about 20 to about 5 volume percent of Ag, and Li:Al alloys, composed of, for example, from about 90 to 99 volume percent of Al, and from about 10 to about 1 volume percent of Li.

The optional metallic layer preferably is thick enough in order to achieve a reduced sheet resistance such as less than about 5 ohms per square, and particularly even less than about 1 ohm per square, and also preferably is thick enough to effectively isolate the light absorbing layer from external environment. However, there is no particular upper limit for the thickness except as may be required by device fabrication considerations. Typically, the metallic layer may have a thickness ranging for example from about 100 Å to about 10,000 Å, and more particularly from about 1,000 Å to about 4,000 Å. Of course, a thickness outside of these ranges can also be used.

The luminescent region is composed of an organic electroluminescent material. Electroluminescent materials include, for example, polyphenylenevinylenes such as poly (p-phenylenevinylene) PPV, poly(2-methoxy-5-(2-ethylhexyloxy)1,4-phenylenevinylene) MEHPPV and poly (2,5-dialkoxyphenylenevinylene) PDMeOPV, and other materials disclosed in U.S. Pat. No. 5,247,190, which is incorporated herein by reference in its entirety; polyphenylenes, such as poly(p-phenylene) PPP, ladder-poly-para-phenylene (LPPP), and poly(tetrahydropyrene) PTHP; and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of organic electroluminescent materials that can be utilized in the luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate) aluminum (AlQ3), which is one preferred example, and bis(8-hydroxyquinolato)-(4-phenylphenolato) aluminum (BAlq) which is another preferred example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

More specifically, a class of organic electroluminescent materials that can be used in the luminescent region comprises stilbene derivatives, such as those disclosed in U.S. Pat. No. 5,516,577, incorporated herein by reference in it entirety. A preferred stilbene derivative is 4,4'-bis(2,2-diphenylvinyl)biphenyl.

Another class of suitable organic electroluminescent materials suitable for utilizing in the luminescent region is the oxadiazole metal chelates. These materials include bis[2-(2-hydroxyphenyl)-5-phenyl-1,3,4-oxadiazolato]zinc; bis[2-(2-hydroxyphenyl)-5-phenyl-1,3,4-oxadiazolato] beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato] beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. Pat. No. 6,057,048, which is incorporated herein by reference in its entirety.

The luminescent region can further include from about 0.01 weight percent to about 25 weight percent of a luminescent material as a dopant. Examples of dopant materials that can be utilized in the luminescent region are fluorescent materials, such as coumarin, dicyanomethylene pyranes, polymethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381 and 5,593,788, each incorporated herein by reference in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in the luminescent region are the fluorescent dyes disclosed in U.S. Pat. No. 5,935,720 (which is incorporated herein by reference in its entirety) such as 4-(dicyanomethylene)-2-I-propyl-6-(1,1,7,7-tetramethyljulolidyl-9-enyl)-4H-pyran (DCJTB); the lanthanide metal chelate complexes, such as for example, tris(acety lacetonato)(phenanthroline) terbium, tris(acetyl acetonato)(phenanthroline) europium, and tris (thenoyl trisfluoroacetonato)(phenanthroline) europium, and those disclosed in Kido et al., "White light emitting organic electroluminescent device using lanthanide complexes," *Jpn. J. Appl. Phys.*, Volume 35, pp. L394–L396 (1996), which is incorporated herein by reference in its entirety; and phosphorescent materials, such as organometallic compounds containing heavy metal atoms that lead to strong spin-orbit coupling, such as those disclosed in Baldo et.al., "Highly efficient organic phosphorescent emission from organic electroluminescent devices," *Letters to Nature*, Volume 395, pp. 151–154 (1998), which is incorporated herein by reference in its entirety. Preferred examples include 2,3,7,8,12,13,17,18-octaethyl-21H23H-phorpine platinum (II) (PtOEP) and fac tris(2-phenylpyridine)iridium (Ir(ppy)$_3$).

The luminescent region can also include one or more materials with hole-transporting properties. Examples of hole-transporting materials that can be utilized in the luminescent region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like A specific class of hole transporting materials that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl) phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis[4'-(N-phenyl-N-m-chlorophenylamino)-4-biphenylyl]-p-toluidine; N,N-bis-[4'-(N-phenyl-N-m-tolylamino)-4- biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the luminescent region are the indolo-carabazoles, such as those disclosed in U.S. Pat. Nos. 5,942,340 and 5,952,115, each incorporated herein by reference in its entirety, such as 5,11-di-naphthyl-5,11-dihydroindolo[3,2-b] carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Preferred hole transporting materials that can be used in the luminescent region are the naphtyl-substituted benzidine derivatives.

The luminescent region can also include one or more materials with electron transporting properties. An example of electron transporting materials that can be utilized in the luminescent region is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices III, Denver, Colo., July 1999, Volume 3797, p. 129.

Other examples of electron transporting materials that can be utilized in the luminescent region can be selected from the metal oxinoid compounds, the oxadiazole metal chelate compounds, the triazine compounds and the stilbene compounds, examples of which have been described above in detail.

In embodiments where the luminescent region includes one or more hole transport material and/or one or more electron transport material in addition to the organic electroluminescent material(s), the organic electroluminescent material, the hole transport material(s), and/or the electron transport material(s) can be formed in separate regions, such as the OLEDs disclosed in U.S. Pat. Nos. 4,539,507; 4,720,432 and 4,769,292; or in the same region thus forming mixed regions of two or more materials, such as the OLEDs disclosed in U.S. Pat. No. 6,130,001, and in U.S. application Ser. No. 09/357,551, filed on Jul. 20, 1999; Ser No. 09/606,670, filed on Jun. 30, 2000; and Ser. No. 09/770,159, filed on Jan. 26, 2001. The disclosures of these patents and patent applications are incorporated herein by reference in their entirety.

The thickness of the luminescent region can vary for example, from about 10 Å to about 10,000 Å, typically from about 200 Å to about 2,000 Å, and particularly from about 500 Å to about 1,500 Å. In embodiments wherein the luminescent region includes two or more layers, the thickness of each layer can, for example, be from about 10 Å to about 5,000 Å, typically from about 50 Å to about 2,000 Å, and particularly from about 100 Å to about 1,500 Å.

The organic light emitting device can be fabricated by sequentially forming the layers comprising the organic light emitting device on the substrate, using any suitable thin film forming technique, typically, spin coating or deposition by thermal evaporation in vacuum. In embodiments, the charge injecting layer, the light absorbing layer, and the optional buffer layer and metallic layer are deposited by thermal evaporation in vacuum.

More details about fabrication and operation of organic light emitting devices are disclosed, for example, in U.S. Pat. Nos. 4,539,507 and 4,769,292, and in copending U.S. application Ser. No. 09/357,551, filed on Jul. 20, 1999; Ser. No. 09/606,670, filed on Jun. 30, 2000; and Ser. No. 09/770,159, filed on Jan. 26, 2001, the disclosure of each patent and patent application being totally incorporated herein by reference.

The invention will now be described in detail with respect to specific preferred embodiments thereof, it being understood that these examples are intended to be illustrative only and the invention is not intended to be limited to the materials, conditions, or process parameters recited herein. All percentages and parts are by weight unless otherwise indicated.

EXAMPLE

An inventive organic light emitting device according to the device structure of FIG. 1 was fabricated. The organic light emitting device was composed of in the sequence:

a substrate made of glass of about 1 mm thickness;

an anode composed of indium tin oxide of about 200 nm thickness;

a luminescent region composed of a hole transport layer of thickness about 60 nm coated on the anode, made of N,N'-di(naphthalene-1-yl)-N,N'-diphenyl-benzidine (NPB), and a luminescent electron transport layer, about 75 nm thick, coated on the hole transport layer made of tris (8-hydroxyquinoline) aluminum (AlQ3); and a cathode including: (a) a substantially transparent electron injecting layer, about 4 nm thick, made of Mg:Ag alloy (9:1 by volume), (b) a buffer layer, about 200 nM thick, made of SiO, (c) a light absorbing layer, about 500 nm thick, made of a black pigment material, Bis (1,8-Naphthimidazo) perinone, and (d) a metallic layer, about 200 nm thick, made of Ag.

COMPARATIVE EXAMPLE

A comparative organic light emitting device, similar to the inventive OLED of the Example but which included a conventional cathode, was fabricated and evaluated. The organic light emitting device was composed of in the sequence:

a substrate made of glass of thickness about 1 mm;

an anode composed of indium tin oxide, of thickness about 200 nm;

a luminescent region, composed of a hole transport layer of thickness about 60 nm coated on the anode, made of N,N'-di(naphthalene-1-yl)-N,N'-diphenyl-benzidine (NPB), and a luminescent electron transport layer, about 75 nm thick, coated on the hole transport layer made of tris (8-hydroxyquinoline) aluminum (AlQ3); and a cathode including: (a) an electron injecting layer, about 120 nm thick, made of Mg:Ag alloy (9:1 by volume); and (b) a metallic layer, about 80 nm thick, made of Ag.

Both the inventive and comparative organic light emitting devices including the 16 cathode layers were fabricated by thermal evaporation in vacuum (about 5×10$^{-6}$ torr.) in the same pump down cycle.

Visual examination of the inventive and comparative organic light emitting devices revealed negligible reflectivity of the cathode of the inventive organic light emitting device, whereas the cathode of the comparative organic light emitting device was highly reflective of ambient illumination, giving it a mirror-like appearance. When operated under 7 volts, emission from the inventive organic light emitting device demonstrated excellent visibility, regardless of the viewing angle, even when viewed under strong ambient illumination from a 200W flood light source placed about 15 cms apart from the device. On the other hand, emission from the comparative organic light emitting device, when operated under 7 volts, was almost invisible under the same ambient illumination conditions.

Other modifications of the present invention may occur to those skilled in the art based upon a reading of the present disclosure and these modifications are intended to be included within the scope of the present invention.

We claim:

1. An organic light emitting device defining a viewer side and comprising:

a first electrode;

a second electrode; and a luminescent region including an organic electroluminescent material between the first electrode and the second electrode, wherein one of the first electrode and the second electrode includes both a single substantially transparent charge injecting layer adjacent to the luminescent region and an electrically conductive light absorbing layer wherein the light absorbing layer is positioned farther from the viewer side than the luminescent region and the light absorbing layer overlays the charge injecting layer to absorb ambient light that passes through the charge injecting layer.

2. The device of claim 1, further comprising a substrate, wherein one of the first electrode and the second electrode is between the substrate and the luminescent region.

3. The device of claim 1, wherein the charge injecting layer has a thickness ranging from about 10 Angstroms to about 50,000 Angstroms.

4. The device of claim 1, wherein the light absorbing layer is deposited by thermal evaporation in vacuum.

5. The device of claim 1, wherein the light absorbing layer exhibits at least about 50% extinction of light entering the light absorbing layer.

6. The device of claim 1, wherein the light absorbing layer exhibits at least about 90% extinction of light entering the light absorbing layer.

7. An organic light emitting device defining a viewer side and comprising in sequence:

(a) a cathode including:
      (i) an electrically conductive light absorbing layer, and
      (ii) a single substantially transparent electron injecting layer;

(b) a luminescent region including an organic electroluminescent material; and (c) an anode that is substantially transparent to light wherein the light absorbing layer is positioned farther from the viewer side than the luminescent region and the light absorbing layer overlays the electron injecting layer to absorb ambient light that passes through the electron injecting layer.

8. The device of claim 7, further comprising a substantially transparent substrate, wherein the anode is between the luminescent region and the substrate.

9. The device of claim 7, further comprising a substrate, wherein the cathode is between the luminescent region and the substrate.

10. The device of claim 7, wherein the cathode further comprises a metallic layer, wherein the light absorbing layer is between the metallic layer and the electron injecting layer.

11. The device of claim 7, wherein the cathode further comprises a buffer layer between the light absorbing layer and the electron injecting layer.

12. The device of claim 7, wherein the electron injecting layer has a thickness ranging from about 10 Angstroms to about 50,000 Angstroms.

13. The device of claim 7 wherein the light absorbing layer is deposited by thermal evaporation in vacuum.

14. The device of claim 7, wherein the light absorbing layer exhibits at least about 50% extinction of light entering the light absorbing layer.

15. The device of claim 7, wherein the light absorbing layer exhibits at least about 90% extinction of light entering the light absorbing layer.

16. An organic light emitting device defining a viewer side and comprising in sequence:

(a) a cathode that is substantially transparent to light;

(b) a luminescent region including an organic electroluminescent material; and (c) an anode including:
      (i) a substantially transparent hole injecting layer, and
      (ii) an electrically conductive light absorbing layer wherein the light absorbing layer is positioned farther from the viewer side than the luminescent region and the light absorbing layer overlays the hole injecting layer to absorb ambient light that passes through the hole injecting layer.

* * * * *